(12) United States Patent
Nagata et al.

(10) Patent No.: US 6,232,174 B1
(45) Date of Patent: May 15, 2001

(54) METHODS FOR FABRICATING A SEMICONDUCTOR MEMORY DEVICE INCLUDING FLATTENING OF A CAPACITOR DIELECTRIC FILM

(75) Inventors: Masaya Nagata; Nobuhito Ogata, both of Nara; Kazuya Ishihara, Soraku-gun; Jun Kudo, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/451,848

(22) Filed: Dec. 1, 1999

(30) Foreign Application Priority Data

Apr. 22, 1998 (JP) .................................. 11-111217
Jan. 28, 1999 (JP) .................................. 11-019394

(51) Int. Cl.⁷ ............................................. H01L 21/8242
(52) U.S. Cl. ........................................... 438/253; 438/626
(58) Field of Search ................... 361/321, 29, 25, 361/51; 437/52, 47, 60, 228, 919; 438/622, 626, 627, 253, 254

(56) References Cited

U.S. PATENT DOCUMENTS 5,053,917  * 10/1991  Miyasaka et al. .................... 361/321
5,436,477  *  7/1995  Hashizume et al. .................. 257/310
5,604,145  *  2/1997  Hasizume et al. ...................... 437/52
5,644,151  *  7/1997  Izumi et al. ........................... 257/306
5,691,219  * 11/1997  Kawakubo et al. .................... 437/52
5,907,787  *  5/1999  Sato ....................................... 438/622
6,083,789  *  7/2000  Huang et al. .......................... 438/254

FOREIGN PATENT DOCUMENTS 8-293581   11/1996   (JP) .
8-335673   12/1996   (JP) .
9-36309     2/1997   (JP) .
10-4178     1/1998   (JP) .
10-189909   7/1998   (JP) .

* cited by examiner

Primary Examiner—David Nelms
Assistant Examiner—Phuc T. Dang
(74) Attorney, Agent, or Firm—Nixon & Vanderhye P.C.

(57) ABSTRACT

In a method for fabrication a semiconductor memory device which has a capacitor having a lower electrode, a dielectric film and an upper electrode stacked in this order, after the dielectric film is formed to a desired film thickness, the dielectric film is flattened by removing the dielectric film by a specified amount. The upper electrode is formed on the flattened

28 Claims, 8 Drawing Sheets

METHODS FOR FABRICATING A SEMICONDUCTOR MEMORY DEVICE INCLUDING FLATTENING OF A CAPACITOR DIELECTRIC FILM

BACKGROUND OF THE INVENTION

The present invention relates to methods for fabricating semiconductor memory devices and, more particularly, to methods for fabricating a semiconductor memory device using a ferroelectric film or a high dielectric constant film as a capacitor insulating film.

SRAMs (Static Random Access Memories) and DRAMs (Dynamic Random Access Memories) have been typical of randomly accessible memory devices. These memories are, however, both volatile. Moreover, the former memories, which require four to six transistor devices per memory cell, have limitations in advancement toward higher integration, while the latter memories, which need the periodical refresh of the capacitor for data holding, have a drawback of increased power consumption.

Under these circumstances, a so-called ferroelectric RAM (hereinafter, referred to as "FRAM") using a ferroelectric as a capacitor dielectric film is attracting attention as a randomly accessible nonvolatile memory device these days. Among others, an FRAM having a memory cell structure similar to the DRAM cell structure has been proposed in, for example, Japanese Patent Laid-Open Publication No. HEI 8-335673, in order to reduce the cell occupancy area.

FIG. 8 shows a memory cell of a conventional stacked type FRAM. This memory cell has a ferroelectric capacitor which includes a lower electrode 27 connected to one source/drain diffusion layer 24 of a MOS transistor, a capacitor ferroelectric film 28 formed on the lower electrode 27, and an upper electrode 31. The capacitor ferroelectric film 28 and the upper electrode 31 are in contact with each other at a top surface of the capacitor ferroelectric film 28. A bit line 33 is connected to the other source/drain diffusion layer 24 of the MOS transistor, a gate electrode 23 of the MOS transistor is connected to a word line, and the upper electrode 31 of the ferroelectric capacitor serves as a drive line. In FIG. 8, reference numeral 21 denotes a silicon substrate, 22 denotes a gate insulator, 25 denotes a first interlayer insulator, 26 denotes a contact plug, 29 denotes a diffusion inhibitor made of $TiO_2$, 30 denotes an insulative thin film made of $SiO_2$, and 32 denotes a second interlayer insulator.

Meanwhile, as the ferroelectric material, there have been proposed $PbZr_xTi_{1-x}O_3$ ("PZT"), and Bi (bismuth) layered structure materials, such as $SrBi_2Ta_2O_9$ ("SBT"), which offers better fatigue characteristics and drivability at lower voltage than PZT. In order to educe the characteristics of these ferroelectric substances, however, a heat treatment process in an oxidizing atmosphere at high temperatures of 600–800° C. as suggested in Japanese Patent Laid-open Publication No. HEI 10-4178 is needed.

However, during the formation of a ferroelectric by heat treatment in an oxidizing atmosphere as described above, particularly with SBT or the like that requires a high treatment temperature, the growth of crystal grains associated with film crystallization progresses relatively nonuniformly, causing the surface morphology of the film to deteriorate with a higher liability to the occurrence of surface irregularities. The deterioration of the film surface morphology or property may cause deterioration of ferroelectric characteristics such as increase in leak current and decrease in isolation voltage or withstand voltage of the ferroelectric film.

Also, in forming amicro capacitor, the uneven surface would lead to the decrease in precision of the capacitor area as well as in adhesion or contact between the ferroelectric film and the upper electrode. Therefore, attempts have been made to improve the surface property of the ferroelectric film by, for example, flattening a Pt lower electrode by electrolytic polishing, as described in Japanese Patent Laid-Open Publication No. HEI 10-189909. The flattening of the Pt lower electrode, however, has not provided a satisfactory solution because, however the lower Pt electrode is flattened, there occur surface irregularities or unevenness due to the grain growth of the ferroelectric film itself during the process of crystallization of the ferroelectric layer after the flattening of the lower Pt electrode. Furthermore, with the mere mechanical polishing such as described in the aforementioned Japanese Patent Laid-Open Publication HEI 10-4178, the ferroelectric film, which is a material vulnerable to mechanical damage and stress, would inevitably undergo considerable deterioration in ferroelectric characteristics, and besides tend to yield scratches. Thus, the mechanical polishing is unsuitable for semiconductor process.

SUMMARY OF THE INVENTION

An object of the present invention is therefore to provide methods for fabricating a semiconductor memory device having good dielectric characteristics, which can solve the above-described problems associated with irregularities of the surface of a dielectric film, especially of a ferroelectric film.

In order to accomplish the object, according to an aspect of the invention, there is provided a method for fabricating a semiconductor memory device, the semiconductor memory device comprising a capacitor having a lower electrode, a dielectric film and an upper electrode stacked in this order, the method comprising the steps of:

forming a dielectric film to a desired film thickness;

flattening a surface of the dielectric film by removing the dielectric film by a specified amount; and forming an upper electrode on the flattened surface of the dielectric film.

According to another aspect of the invention, there is provided a method for fabricating a semiconductor memory device having a MOS transistor and a capacitor formed on a semiconductor substrate, a source/drain of the MOS transistor being connected with a lower electrode of the capacitor by an electrical conductor, the method comprising the steps of:

depositing a lower electrode material and a dielectric material in this order and patterning these materials together into a lower electrode and a dielectric film of the capacitor;

forming an insulating film all over the semiconductor substrate including the lower electrode and the dielectric film;

forming an opening in the insulating film to expose a surface of the dielectric film;

flattening the exposed surface of the dielectric film by removing the dielectric material by a specified amount; and forming an upper electrode in contact with the flatted surface of the dielectric film.

According to still another aspect of the present invention, there is provided a method for fabricating a semiconductor memory device having a MOS transistor and a capacitor formed on a semiconductor substrate, a source/drain of the MOS transistor being connected with a lower electrode of the capacitor by an electrical conductor, the method comprising the steps of:

depositing a lower electrode material and a dielectric material in this order;

flattening a surface of the dielectric material by removing the dielectric material by a specified amount;

depositing an upper electrode material on the flatted dielectric material;

patterning the lower electrode material, the dielectric material and the upper electrode material together into a lower electrode, a dielectric film and an upper electrode of the capacitor, respectively;

forming an insulating film all over the resulting semiconductor substrate including the lower electrode, dielectric film and upper electrode;

forming an opening in the insulating film to expose a surface of the upper electrode; and forming a drive line of a wiring material in contact with the exposed surface of the upper electrode.

In these methods, the dielectric film may be a ferroelectric film or a high dielectric constant film.

By applying the present invention to fabrication of a semiconductor memory device, because the dielectric film surface to be in contact with the upper electrode is flattened to have a flatness of, for example, 50 nm or lower, a superior adhesion and a good interface state between the dielectric film and the upper electrode are obtained, so that superior leak current and isolation voltage characteristics are also obtained. Accordingly, a highly reliable capacitor is realized. Therefore, when the dielectric film is a ferroelectric film, an FRAM with increased reliability is realized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
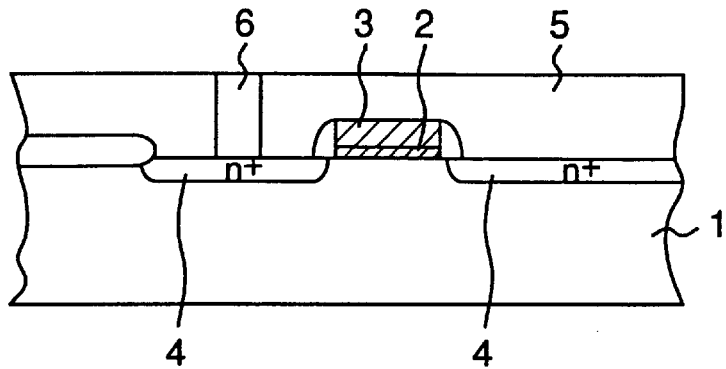
FIGS. 1A, 1B, 1C, 1D and 1E are explanatory process diagrams showing an example of the semiconductor memory device fabrication method according to the present invention.

The present invention is described in detail below with reference to embodiments thereof.

[First Embodiment]

A semiconductor memory device according to a first embodiment mainly comprises a MOS transistor and a ferroelectric capacitor in a stacked structure. Also, the MOS transistor has a gate insulator, a gate electrode and a pair of diffusion layers, formed on a silicon substrate. The gate insulator, the gate electrode and the diffusion layers are formed of materials used for ordinary transistors, and have respective film thicknesses and sizes similar to those of the ordinary transistors. The ferroelectric capacitor comprises a lower electrode, a ferroelectric film as a capacitor insulator, and an upper electrode. The lower electrode is often made of Pt, Ir, $IrO_2$ or their composite or combined films, but may also be made of Rh, $RhO_x$, a Rh and $RhO_x$, laminate ($Rh/RhO_x$), a Pt—Rh alloy (PtRh), an oxide of Pt—Rh alloy ($PtRhO_x$), a $PtRhO_x$ and PtRh laminate ($PtRhO_x$/PtRh), or the like. For stacked type capacitors, however, the following electrodes are effective: a $PtRhO_x$/PtRh electrode, a $Pt/IrO_2$ electrode, and barrier metal-combined electrodes, such as an Ir/TiN electrode, an $IrO_2$/Ir/TiN electrode, a Pt/Ir/TiN electrode, a $Pt/IrO_2$/Ir/TiN electrode, an Ir/TaSiN electrode, an $IrO_2$/Ir/TaSiN electrode, a Pt/Ir/TaSiN electrode, $Pt/IrO_2$/Ir/TaSiN electrode, etc., although these electrodes are not limitative.

Also, the film thickness of the lower electrode in this case is not particularly limited, and may be adjusted depending on the electrode materials, capacitor size or the like. However, in view of the processability, the lower electrode is, preferably, formed to a film thickness of around 100–300 nm.

The ferroelectric film can be made of PZT, PLZT obtained by adding La to PZT, and materials obtained by adding other impurities to PZT. Materials more suitable for obtaining good effects as the ferroelectric film are, however, Bi-based laminar oxides, such as typical $SrBi_2Ta_2O_9$ which needs a high crystallization temperature, $BaBi_2Nb_2O_9$, $BaBi_2Ta_2O_9$, $PbBi_2Ta_2O_9PbBi_2Nb_2O_9$, $PbBi_4Ti_4O_{15}$, $SrBi_4Ti_4O_{15}$, $BaBi_4Ti_4O_{15}$, $Sr_2Bi_4Ti_5O_{18}$, $Ba_2Bi_4Ta_5O_{18}$, $Pb_2Bi_4Ti_5O_{18}$, $Na_{0.5}Bi_{4.5}Ti_4O_{15}$, $K_{0.5}Bi_{4.5}Ti_4O_{15}$, $SrBi_2(Ta_x,Nb_{1-x})_2O_9$, $Bi_4Ti_3O_{12}$, etc., and solid solutions exemplified by $(SrBi_2Ta_2O_9)_y \cdot (Bi_3TiTaO_9)_{1-y}$, or $(SrBi_2(Ta_x,Nb_{1-x})_2O_9)_y \cdot (Bi_3TiTaO_9)_{1-y}$, where $0<y<1$. In addition, it is desirable that these materials are used at a film thickness of around 50–300 nm, in view of the capacitor operating voltage and processability.

The upper electrode maybe made of Pt, Ir, $IrO_2$ or their composite or combined films, which materials are not limitative. The upper electrode may also be made of Rh, $RhO_x$, an Rh and $RhO_x$ laminate ($Rh/Rho_x$), a Pt—Rh alloy (PtRh), an oxide of Pt—Rh alloy ($PtRhO_x$), a $PtRhO_x$ and PtRh laminate ($PtRhO_x$/PtRh), or the like. The film thickness of the upper electrode is desirably 50–300 nm in view of processability.

In the semiconductor memory device of the present invention, when its memory cell has a stacked type capacitor, one source/drain diffusion layer of the MOS transistor is connected with a contact plug as an electrical conductor. The contact plug is made of any suitable material, and polysilicon or the like doped with metal or impurities may be used in the form of a single layer or along with a barrier metal. Also, the gate electrode of the MOS transistor functions as a word line, while the other source/drain diffusion layer of the MOS transistor is connected to a bit line. The upper electrode of the ferroelectric capacitor either functions as a drive line by itself or is connected to a drive line.

Next, the method for fabricating the semiconductor memory device according to the first embodiment is described.

First, a MOS transistor is formed on a silicon substrate, and on top of this, an interlayer insulator is stacked. A gate insulator, a gate electrode, and diffusion layers (source and drain) of the MOS transistor as well as the interlayer insulator are formed by any known process.

Next, a contact hole is formed in the interlayer insulator so that the hole leads to one diffusion layer, and a contact plug is formed in the contact hole. The contact hole can be formed by a known method, for example, photolithography process and dry etching with $Cf_4/CHF_3$ gases or wet etching. The contact plug is formed by depositing an electrical conductor on the resulting semiconductor substrate including the contact hole and then etching back the conductor by chemical mechanical polishing ("CMP"). Because the CMP process is a chemically assisted polishing process, as compared with the merely mechanical polishing used in the described prior art, the CMP process is relatively low in mechanical process damage and capable of scratch-free mirror polishing. Thus, the CMP process is suitable for semiconductor processes.

Next, the lower electrode material and the ferroelectric material are deposited in this order on the entire surface of the semiconductor substrate resulting from the above process, and then patterned into desired configurations using a mask so that the lower electrode and the capacitor ferroelectric film are formed. The lower electrode material can be deposited by sputtering process or the like. Also, the ferroelectric material can be deposited by any of MOCVD (Metal Organic Chemical Vapor Deposition) process, sol-gel process, MOD (Metal Organic Decomposition) process, sputtering process, etc. As an example, when an SBT film is formed by the MOD process, an SBT solution (composition ratio of solution: Sr/Bi/Ta=8/24/20) is applied onto the lower electrode to a thickness of about 50 nm by spin coating, and then dried at 250° C. for 5 minutes. This process is repeated four times, whereby an SBT film having a film thickness of about 200 nm is obtained. After this, the SBT film is thermally treated in an oxygen atmosphere and at a substrate temperature of 650–800° C. for about 30–180 minutes so as to be crystallized. In this way, an SBT ferroelectric is completed.

The patterning of the lower electrode and the ferroelectric layer can be achieved by dry etching with a gas such as chlorine-based gas or fluorine-based gas or any other suitable process. Preferably, after the completion of the patterning, heat treatment is performed at about 50–700° C. for about 30 seconds–30 minutes in an atmosphere of oxygen, nitrogen or their mixed gas to repair etching-induced damage on the ferroelectric surface.

Next, an insulating film is formed on the entire surface of the semiconductor substrate obtained by the above process. The insulating film may be an $SiO_2$ film or a laminated film of $TiO_2$ and $SiO_2$ wherein $TiO_2$ serves as a film for inhibiting reaction between the ferroelectric film and $SiO_2$.

Then, an opening is formed in the insulating film of, for example, $TiO_2/SiO_2$ on the capacitor ferroelectric film. To form the opening, a mask may be formed, and then the $TiO_2/SiO_2$ laminated film may be etched with $CHF_3$, $CF_4$ or the like.

Next, since the SBT film exposed through the opening of the insulating film has a film surface with considerable irregularities resulting from the crystallization process, the exposed SBT film surface is flattened by dry etching process. By the implementation of this flattening process, it is possible to improve surface property and morphology of the ferroelectric film, to prevent the precision of the capacitor area or dimension from deterioration after the formation of the upper electrode, and to enhance the adhesion, or contact between the ferroelectric layer and the upper electrode. Further, by virtue of the flattened interface between the ferroelectric film and the upper electrode, it is possible to prevent insulation strength deterioration and leak current increase as caused by electric field concentration due to irregularities of the interface, so that improvement of characteristics can be achieved.

To flatten the ferroelectric film such as an SBT film by dry etching, ECR (Electron Cyclotron Resonance) plasma etching equipment, for example, can be used.

As the etching gas, a mixed gas of $Cl_2$, $C_2F_6$ and $CH_4$ can be used. The etching amount is desirably set at 20–50% of the initial film thickness. If the etching amount is less than 20%, the ferroelectric film is not sufficiently flattened. If the etching amount is more than 50%, the ferroelectric characteristic is more likely to be impaired. In addition, as to the etching gas, although a mixed gas of $Cl_2$, $C_2F_6$ and $CH_4$ has been shown above, similar etching for flattening process can be achieved also by using halogen such as fluorine, bromine or iodine in place of $Cl_2$, a halogen compound such as HF, $CF_4$, $C_2F_6$, $C_3F_8$, $C_4F_{10}$, $SF_6$, $S_2F_2$, HCl, $BCl_3$, $CCl_4$, $CHFCl_2$, $CBr_4$, $BrF_3$, $S_2Br$ and IBr in place of $C_2F_6$, and hydrocarbon such as ethane, propane, or butane in place of $CH_4$.

After these etching processes, for repairing etching-induced damages on the ferroelectric surface, heat treatment is desirably performed at 500–700° C. for 30 seconds–30 minutes in an atmosphere of oxygen, nitrogen or their mixed gas.

Next, the upper electrode material is deposited all over the resulting substrate having the flattened ferroelectric surface, patterned into a desired configuration, and processed so as to function as a drive line by itself or be connectable with a drive line in subsequent process. The depositing and patterning of the upper electrode material can be performed in a way similar to that for the lower electrode material, although depending on the material used. When a drive line is formed separately, the processes of forming and patterning the insulating film and depositing and patterning the electrode material are repeated to form a desired device. In addition, after the device is formed by these processes, a protective insulating film is formed to a film thickness of, for example, about 200–600 nm by a known process.

Alternatively, a lower electrode material and a ferroelectric material are deposited in this order and then the ferroelectric material may be flattened in advance by etching, chemical mechanical polishing (CMP) or any other suitable method. After that, an upper electrode may be formed and then the patterning of the upper electrode, the ferroelectric layer and the lower electrode may be carried out by dry etching using a chlorine-based gas, a fluorine-based gas, or the like, or any other suitable method to thereby form the ferroelectric capacitor.

EXAMPLE 1

FIGS. 1A–1E show process steps of an illustrative example of the semiconductor memory device fabrication method according of the first embodiment of the present invention.

Figure 1B:
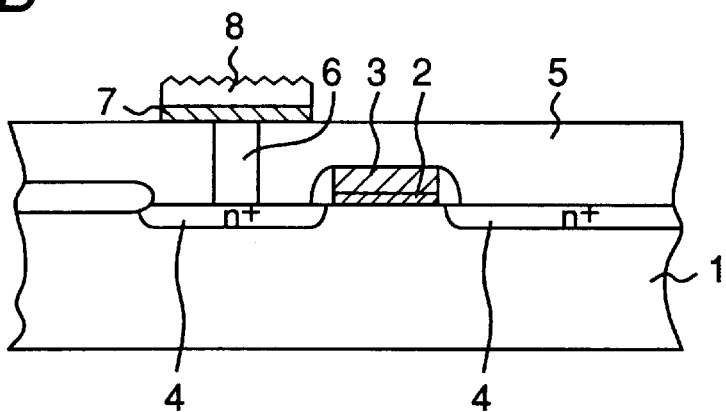
Figure 1C:
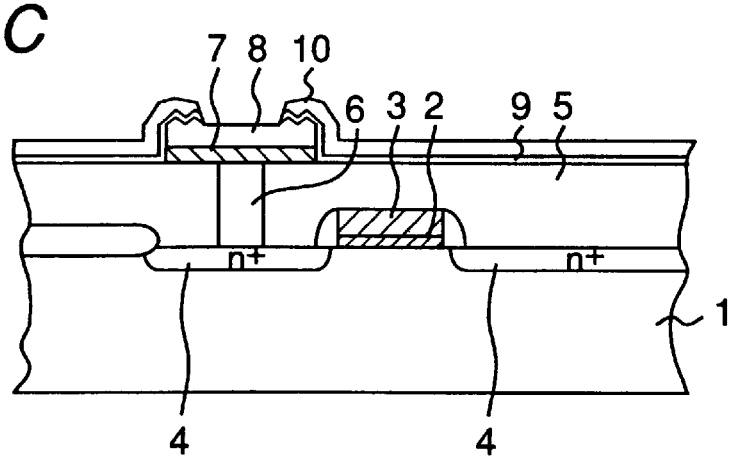
Figure 1D:
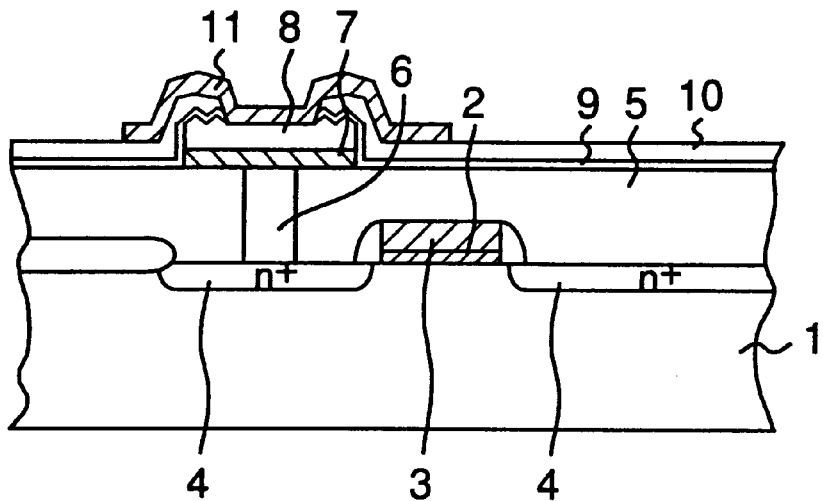
Figure 1E:
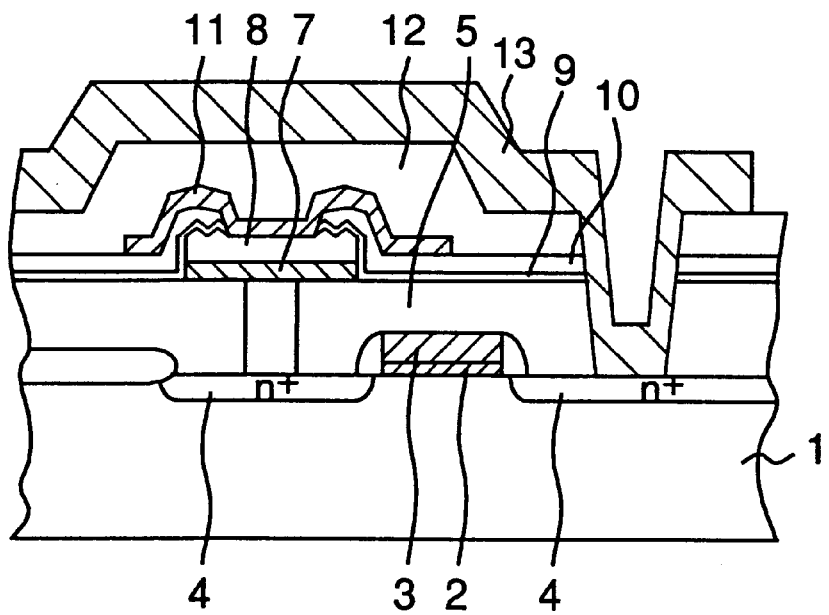

A semiconductor memory device of this example, as shown in FIG. 1E, consists essentially of one transistor and one ferroelectric capacitor. The transistor comprises a gate electrode 3 formed via a gate insulator 2 on a semiconductor substrate 1 and functioning as a word line, and source/drain diffusion layers 4 formed in self-alignment with the gate electrode 3. The ferroelectric capacitor is made up by stacking a lower electrode 7, a capacitor ferroelectric film 8, and an upper electrode 11 functioning as a drive line in this order. A first interlayer insulator 5 made of a BPSG (borophospho silicate glass) film is formed on the transistor, and the ferroelectric capacitor is disposed on the first interlayer insulator 5.

The lower electrode 7 of the ferroelectric capacitor is electrically connected to one source/drain diffusion layer 4 of the transistor via a contact plug 6 formed in the first interlayer insulator 5.

The lower electrode 7 and the capacitor ferroelectric film 8 are coated with a $TiO_2$ film 9 and a $SiO_2$ film 10 which are stacked on the capacitor ferroelectric film 8 and on the interlayer insulator 5 and which have an opening on the capacitor ferroelectric film 8. The upper electrode 11 is so formed as to coat the lower electrode 7, the capacitor ferroelectric film 8 and the laminated film of the $TiO_2$ film 9 and the $SiO_2$ film 10. Also, a bit line 13 is electrically connected to the other source/drain diffusion layer 4 of the transistor.

Now a fabrication process of this semiconductor memory device is described below with reference to FIGS. 1A–1E.

First, as shown in FIG. 1A, a BPSG film 5 is deposited as a first interlayer insulator on the silicon substrate 1 having a MOS transistor, and planarized, or flattened, by reflow. After that, a resist pattern (not shown) for contact hole formation is formed, and with this resist pattern used as a mask, the BPSG film 5 is etched with a $CF_4/CHF_3$ gas, whereby a contact hole leading to a source/drain diffusion layer 4 is formed. Polysilicon is deposited to about 450 nm on the silicon substrate 1 so as to fill up the contact hole, and then doped with phosphorus by thermal diffusion. Polysilicon is etched back by the CMP process so that the polysilicon deposited on the BPSG film 5 is completely removed, whereby a contact plug 6 made of polysilicon is completed. At this time, the "flatness" of the etched-back contact plug 6 is suppressed to below 30 nm. It is noted here that the term "flatness" herein refers to an altitude difference between an uppermost and a lowermost points of a typical profile curve of a top surface in a specified 1 to few $\mu m$ region of a thin film, in cross-section, as observed under magnification by a technique such as scanning electron microscopy.

Next, as shown in FIG. 1B, Ir, TaSiN, and Ti (Ir/TaSiN/Ti) as lower electrode materials are deposited to 150–200 nm, 50–100 nm, and 30–100 nm, respectively, on the contact plug 6 and the BPSG film 5 by sputtering process. Subsequently, an SBT film as a ferroelectric film is deposited to about 200 nm in a manner as described above using the MOD process, and crystallized at a temperature of 650° C.–800° C. A mask is then formed by photolithography, and with the use of this mask (not shown), the lower electrode materials and the SBT film are simultaneously patterned with a chlorine- or fluorine-based gas, to thereby form the lower electrode 7 and the capacitor ferroelectric film 8.

Next, by reactive sputtering, a $TiO_2$ film 9 serving as a diffusion inhibitor is deposited to a thickness of 30–100 nm on the capacitor ferroelectric film 8, and on its top, a $SiO_2$ film 10 is deposited to a thickness of 100–200 nm. After that, an opening having a desired configuration is formed in the laminate consisting of the $TiO_2$ film 9 and the $SiO_2$ film 10 by photolithography and etching processes.

Next, as shown in FIG. 1C, planarization or surface-flattening etching process for the SBT film 8 is performed by using ECR plasma etching equipment. Cl, $C_2F_6$ and $CH_4$ as etching gases are introduced at a flow rate of 36 sccm, 36 sccm, and 4 sccm, respectively, and conditions are set to an etching pressure of 1.4 Torr, a microwave output of 1000 W, an RF output of 100 W and a substrate surface temperature of −5° C. The etching amount is set to 25% of the whole film thickness of 200 nm, i.e., 50 nm, so that the final film thickness of the SBT film 8 is 150 nm. In this case, the flatness of the SBT film 8 is below 50 nm. Then, in order to repair the etching induced damage of the capacitor ferroelectric film 8, a furnace annealing is performed at 500–700° C. for 30 seconds–30 minutes in an atmosphere of $O_2$, $N_2$, or their mixed gases.

With respect to the 150 nm thick SBT film subjected to the flattening process in this way and an SBT film which has been formed originally at a 150 nm thickness and not subjected to the flattening process, both crystallized by a 700° C. furnace annealing, these SBT films were compared with each other in characteristics. As a result, the remnant polarization value was 12 $\mu C/cm^2$ in either case, whereas the isolation voltage was 9–10 V at most in the latter case and as high as 15–20 V in the former case. Such a high isolation voltage can be attributed to the fact that when the upper electrode is formed on the flattened SBT film, the interface between the SBT film and the upper electrode is held flat, so that electric field concentration can be suppressed.

Then, as shown in FIG. 1D, Pt, Ir, $IrO_2$ or a composite film of any of these materials is deposited as the upper electrode material to a film thickness of 50–200 nm all over the $SiO_2$ film 10 including the opening by sputtering process. A mask is formed by photolithography process, and using this mask, the upper electrode material is patterned with a chlorine- or fluorine-based gas to form the upper electrode 11 serving as a drive line. Further, as shown in FIG. 1E, a $SiO_2$ film 12 is deposited to a thickness of 200–300 nm by CVD process, and after a contact hole is formed leading to the other source/drain diffusion layer 4 of the MOS transistor, a bit line 13 is formed of AiSiCu/TiN/Ti which is electrically connected to that source/drain diffusion layer 4. As a result, a semiconductor memory device (FRAM) is completed.

EXAMPLE 2

FIGS. 2A–2F show process steps of another illustrative example of the semiconductor memory device fabrication method according to the first embodiment of the present invention, which will be described next with reference to these figures. In FIGS. 2A–2F, parts similar to the parts in FIGS. 1A–1E are designated by the same reference numerals as those used in FIGS. 1A–1E.

Figure 2A:
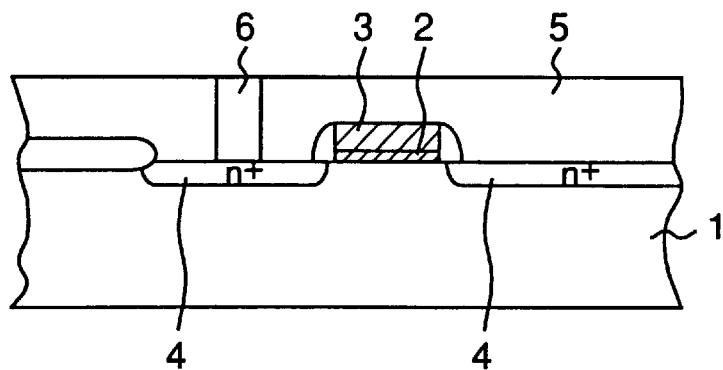
FIGS. 2A, 2B, 2C, 2D, 2E, and 2F are explanatory process diagrams showing another example of the semiconductor memory device fabrication method according to the present invention.

First, device isolating films (not shown) are formed on a semiconductor substrate 1 to define an active region. Thereafter, a MOS transistor is formed by ordinary transistor formation process. Next, as shown in FIG. 2A, a BPSG film 5 is deposited as an interlayer insulator on the silicon substrate 1 including the MOS transistor. Then, a resist pattern (not shown) for contact hole formation is formed, and with this resist pattern used as a mask, the BPSG film 5 is etched with a $CF_4/CHF_3$ gas to thereby form a contact hole leading to one of source/drain diffusion layers 4. Polysilicon is deposited to a thickness of about 450 nm on the silicon substrate 1 so as to fill up the contact hole, and doped with phosphorus by thermal diffusion. The polysilicon is etched back by CMP process so that the polysilicon deposited on the BPSG film 5 is completely removed. Thus, a contact plug 6 is formed.

Figure 2B:
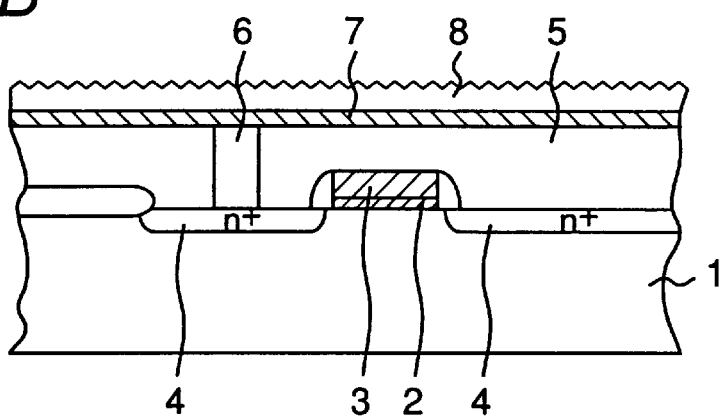

Next, as shown in FIG. 2B, a lower electrode material 7 similar to the material used in Example 1 is deposited on the contact plug 6 by sputtering. Subsequently, an SBT film 8 is deposited to a thickness of about 200 nm in the same way as in Example 1 using the MOD technique, and then crystallized at a temperature of 650–800° C.

Figure 2C:
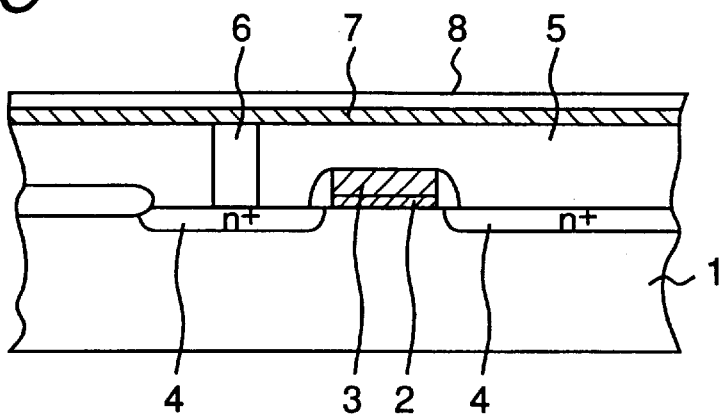

After that, as shown in FIG. 2C, a surface-flattening etching process for the SBT film 8 is performed using ECR plasma etching equipment in the same way as in Example 1. The etching amount is set to 25% of the whole film thickness of 200 nm, i.e., 50 nm, so that the final film thickness of the SBT film is 150 nm. In this case, the flatness of the SBT film 8 is below 50 nm.

Figure 2D:
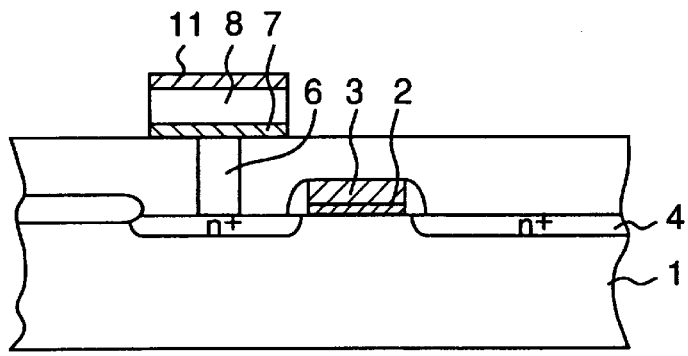

Next, an upper electrode material 11 similar to the upper electrode material of Example 1 is deposited by sputtering process, and then a mask is formed by photolithography. The stacked upper electrode material, SBT film, and lower electrode are patterned by etching techniques using the mask and a chlorine- or fluorine-based gas. Thus, a ferroelectric capacitor shown in FIG. 2D is formed. Then, in order to repair etching-induced damages of the upper electrode, a furnace annealing or rapid thermal annealing (RTA) process is performed in an oxygen atmosphere at 550–700° C. for 1–30 minutes.

Figure 2E:
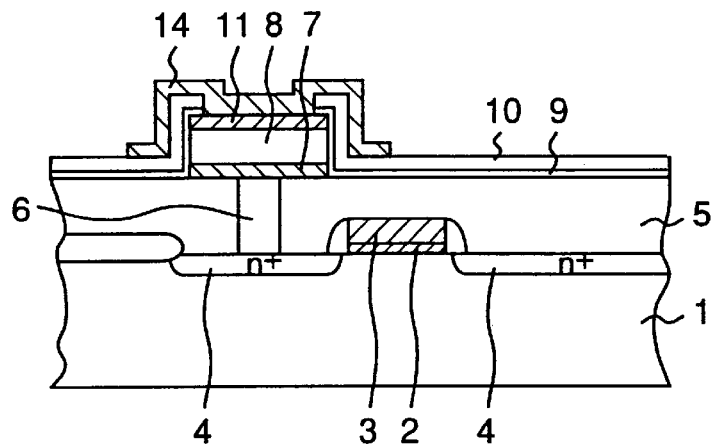
Figure 2F:
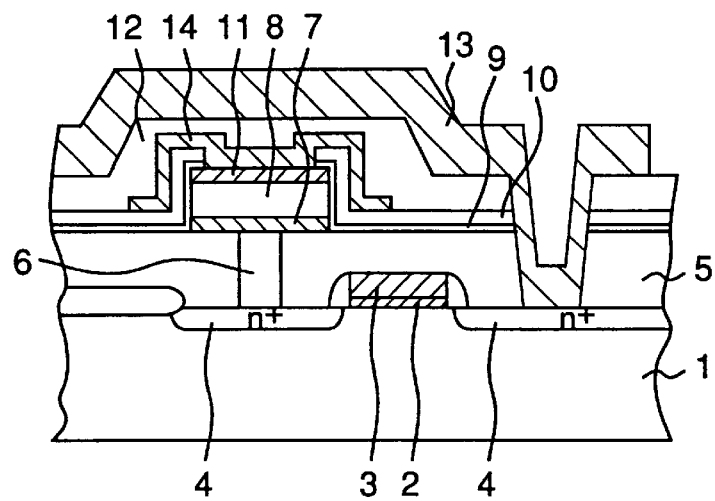

Next, referring to FIG. 2E, similar to Example 1, a $TiO_2$ film 9 and a $SiO_2$ film 10 are formed so as to cover the ferroelectric capacitor, and then an opening having a desired configuration is formed in these films by photolithography and etching techniques. Then, wiring is implemented by a first laminated layer of AiSiCu/TiN/Ti to form a drive line 14. Further, an $SiO_2$ film 12 serving as a second interlayer insulator is deposited to a thickness of 200–300 nm by a CVD technique, and after a contact hole is formed in the $SiO_2$ interlayer insulator film 12, a bit line 13 electrically connected to the other source/drain diffusion layer 4 of the MOS transistor is formed with a second laminated layer of AiSiCu/TiN/Ti. In this way, a semiconductor memory device (FRAM) shown in FIG. 2F is completed.

The fabrication method of Example 1, in which the flattening, or planarization, of the capacitor ferroelectric film 8 is done after forming an opening in the $TiO_2$ film 9 and the $SiO_2$ film 10, is capable of preventing deterioration of the capacitor ferroelectric film 8 better than in Example 2 in which the flattening process precedes the formation of the $TiO_2$ film 9 and the $SiO_2$ film 10 and an opening therein. Thus, Example 1 is preferable to Example 2.

As described above in detail, according to the present embodiment, because the ferroelectric film surface which has been flattened is in contact with the upper electrode, superior adhesion, good interface state, less leak current, and superior isolation or withstand voltage characteristics can be obtained, and a high reliability is ensured. Therefore, a highly reliable capacitor can be obtained, which makes it possible to improve the reliability of the FRAM itself.

In the above first embodiment, a conductive plug is used to electrically connect the capacitor lower electrode with the source/drain region of the transistor. The present invention, however, consists essentially in the flattening or planarization of the dielectric film of the capacitor, and therefore, is also applicable to fabrication of semiconductor memory devices wherein the capacitor lower electrode is connected with the source/drain region of the transistor in any other suitable manner. Accordingly, the description of the following embodiments is centered on the formation of the capacitor section.

[Second Embodiment]

FIGS. 3A–3D are semiconductor memory device fabrication process step diagrams according to a second embodiment of the present invention. In the figures, reference numeral 41 denotes a semiconductor substrate, 42 denotes a silicon oxide, 43 denotes a $TiO_2$ adhesion layer, 44 denotes a lower Pt electrode, 45 denotes a $SrBi_2Ta_2O_9$ film, and 46 denotes an upper Pt electrode.

Figure 3A:
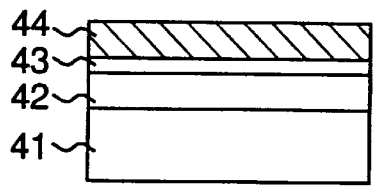
FIGS. 3A, 3B, 3C and 3D are explanatory process diagrams showing another example of the semiconductor memory device fabrication method according to the present invention.

First, as shown in FIG. 3A, the silicon oxide 42 having a film thickness of about 300 nm is formed on the silicon substrate 41 by thermal oxidation, and on top of the silicon oxide 42, the $TiO_2$ adhesion layer 43 and the lower Pt electrode 44 are formed to 30 nm and 200 nm, respectively, by sputtering process.

Figure 3B:
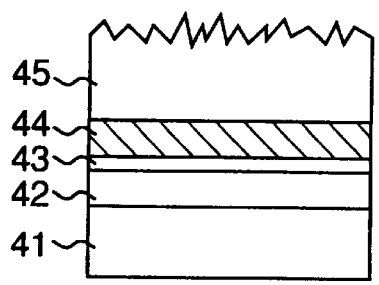

Next, as shown in FIG. 3B, by the MOD (Metal Organic Decomposition) process, a $SrBi_2Ta_2O_9$ solution (composition ratio of solution: Sr/Bi/Ta=8/24/20) is applied as a ferroelectric material onto the lower Pt electrode 44 to a thickness of about 50 nm by spin coating, and subjected to drying process at 250° C. for 5 minutes. This process is repeated totally four times. As a result, the $SrBi_2Ta_2O_9$ film 45 having a film thickness of about 200 nm is obtained. Film thicknesses of the $SrBi_2Ta_2O_9$ film 45 thinner than 100 nm would make it difficult to obtain ferroelectric characteristics, and film thicknesses thicker than 250 nm would make the film formation process by MOD or the like complex and the cost increased. Therefore, the film thickness of the $SrBi_2Ta_2O_9$ film 45 is desirably between 100 nm and 250 nm.

Then, the $SrBi_2Ta_2O_9$ film is heat treated at a substrate temperature of 700–800° C. in an atmosphere of oxygen for 60 minutes so that the $SrBi_2Ta_2O_9$ film is crystallized.

Figure 3C:
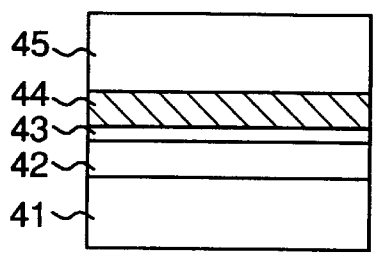

Next, as shown in FIG. 3C, surface etching process for the $SrBi_2Ta_2O_9$ film 45 is performed by using ECR plasma etching equipment. Gases of $Cl_2$ (chlorine), $C_2F_6$, and $CH_4$ (methane) are introduced as the etching gas at a flow rate of 36 sccm, 36 sccm, and 4 sccm, respectively, and conditions are set to an etching pressure of 1.4 Torr, a microwave output of 1000 W, an RF output of 100 W and a substrate surface temperature of –5 C.

In this embodiment, a mixed gas of chlorine, $C_2F_6$ and methane is used as the etching gas. However, the present invention is not limited to this, and similar etching can be achieved also by using halogen such as fluorine, bromine or iodine in place of chlorine, a halogen compound such as HF, $CF_4$, $C_3F_8$, $C_4F_{10}$, $SF_6$, $S_2F_2$, HCl, $BCl_3$, $CCl_4$, $CHFCl_2$, $CBr_4$, $BrF_3$, $S_2Br_2$, or IBr in place of $C_2F_6$, and a hydrocarbon such as ethane, propane, or butane in place of methane.

It is appropriate to use at least one kind of etching gas selected from a group consisting of the foregoing halogen gases, the foregoing halogen compounds and rare gases. Also, when hydrocarbon is added as an organic etching gas to any of these etching gases, film loss of the resist serving as an etching mask can be reduced so that a high precision patterning is achieved. Helium, neon, krypton, argon, xenon or the like may be used as the rare gas, which contributes to physical etching during the sputtering.

The etching amount is set to 25% of the total film thickness of 200 nm immediately after the film formation process, i.e., 50 nm, so that the final film thickness of the $SrBi_2Ta_2O_9$ film 45 is 150 nm. An etching amount of 20% or less would result in insufficient flattening of the $SrBi_2Ta_2O_9$ film 45. Also, an etching amount of 50% or more would result in impaired ferroelectric characteristics of the $SrBi_2Ta_2O_9$ film 45. The etching makes the surface less rough than immediately after the film formation process. The film surface flatness after the etching is desirably ±500 Å or lower.

Figure 3D:
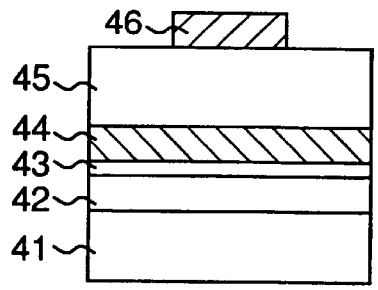

Next, as shown in FIG. 3D, an upper Pt electrode 46 is formed on the $SrBi_2Ta_2O_9$ film 45, and processed to 100× 100 $\mu m^2$ by dry etching process. After that, a heat treatment process is performed in an oxidizing atmosphere at a substrate temperature of 700–800° C. for 30 minutes.

Process damage during the formation of the micro capacitor was evaluated. After the formation of the upper Pt electrode 46, the resulting semiconductor substrate, or wafer, was immersed in a resist stripping solution (e.g., "OMR-810" made by TOKYO OKA K.K.) which is commonly used to form micro capacitors, and characteristics of the $SrBi_2Ta_2O_9$ film 45 before and after the submersion were observed. The temperature of the resist stripping solution was 110° C., and the immersion time was 10 minutes.

Figure 4:
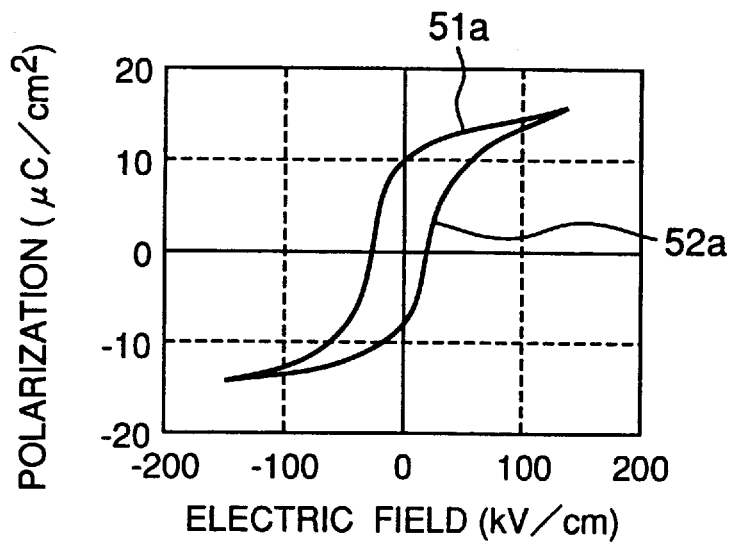
FIG. 4 is a chart showing a hysteresis characteristic of a capacitor made by using the process steps of FIGS. 3A–3D.
Figure 5:
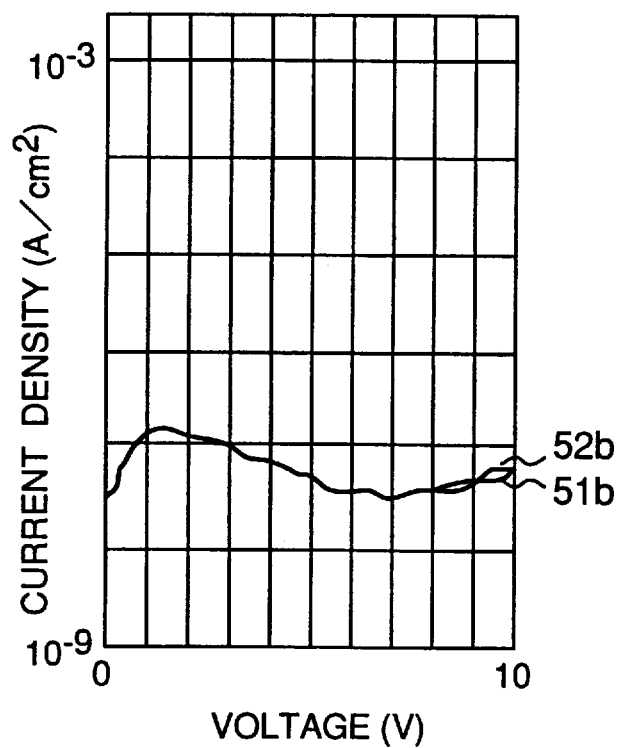
FIG. 5 is a chart showing a current-voltage characteristic of the capacitor.
Figure 6:
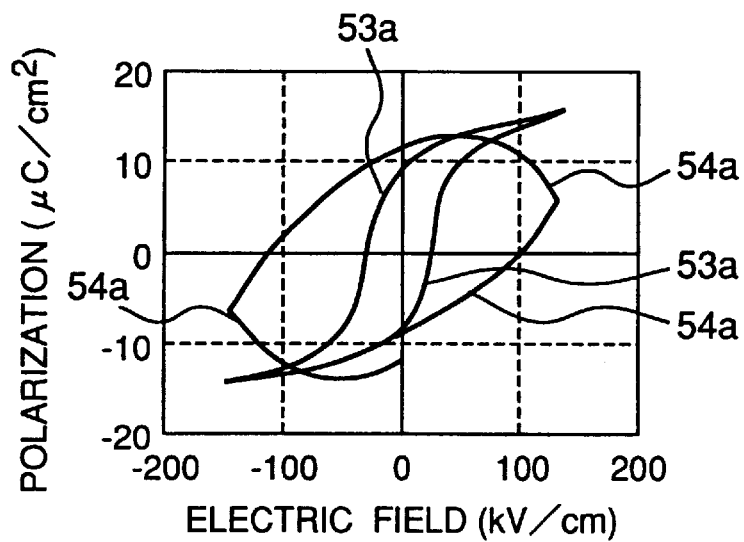
FIG. 6 is a chart showing a hysteresis characteristic of a capacitor as a comparative example.
Figure 7:
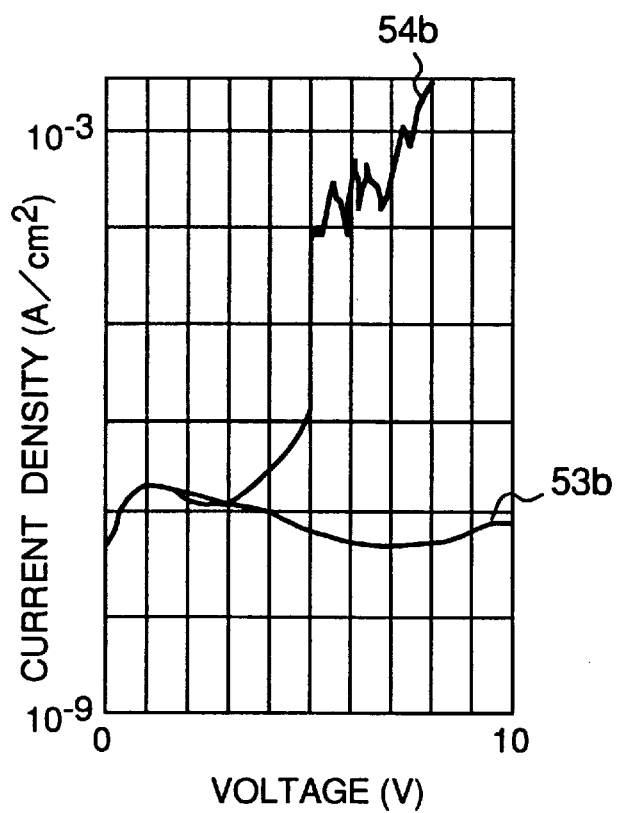
FIG. 7 is a chart showing a current-voltage characteristic of the comparative capacitor.
Figure 8:
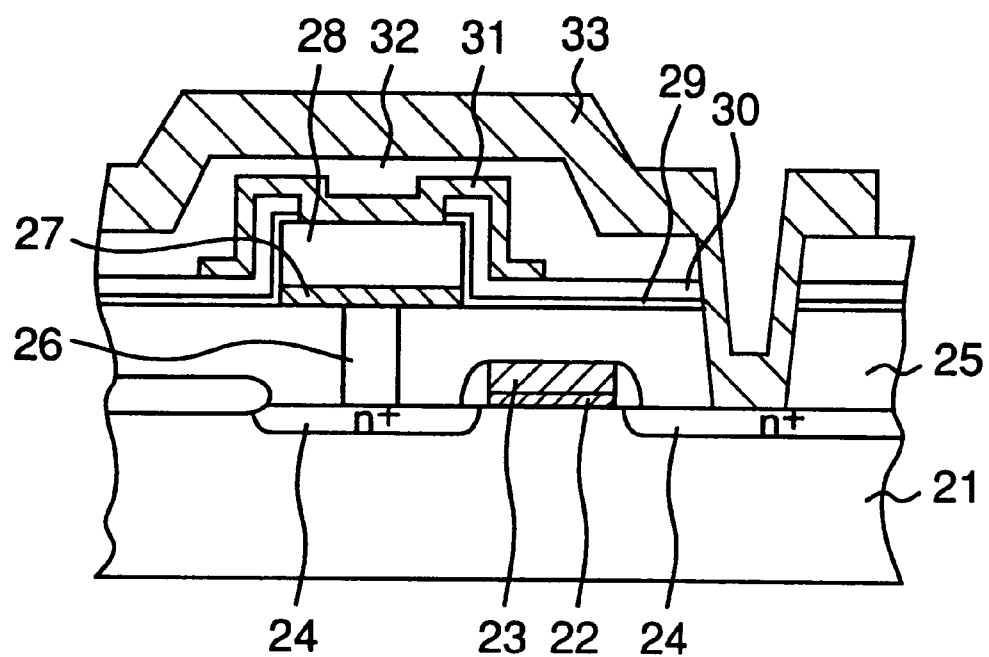
FIG. 8 is a sectional view of a semiconductor memory device having a ferroelectric capacitor according to the prior art.

FIGS. 4 and 5 show a hysteresis characteristic and a current-voltage characteristic, respectively, of the capacitor made by using the process steps of this embodiment. FIGS. 6 and 7 show a hysteresis characteristic and a current-voltage characteristic, respectively, of a capacitor as a comparative example made without applying this embodiment. Curves 51a, 51b and 53a, 53b are characteristic curves before the immersion in the resist stripping solution, and curves 52a, 52b and 54a, 54b are characteristic curves after the immersion in the resist stripping solution. The capacitor of this embodiment exhibited almost no changes in hysteresis profile nor leak current characteristic after the immersion in the resist stripping solution, whereas the capacitor that was made without using the present invention resulted in a collapse of the hysteresis profile and an increase in the leak current characteristic after the immersion in the solution.

With the use of the present invention, because the surface of the ferroelectric layer is flat, the adhesion between the ferroelectric layer and the upper Pt electrode is improved. As a result, the stripping solution is prevented from entering between the ferroelectric layer and the upper electrode so that damages such as a damage causing the deterioration of the ferroelectric film characteristic are avoided.

In the ferroelectric layer planarization process, chemical mechanical polishing (CMP) can be used instead of the dry etching process. In this case, after forming the $SrBi_2Ta_2O_9$ film as shown in FIG. 3B, the resulting semiconductor substrate, or wafer, is set on a carrier in CMP equipment. In an exemplary ferroelectric layer planarization process by the CMP technique, the carrier for supporting the wafer was set to a speed of rotation of 35 rpm, a platen for carrying a polishing cloth was set to 25 rpm, and a pressure of 10 psi was applied to between the wafer and the rotating cloth while both members are being rotated in the same direction. Slurry amount was set to 200 sccm. Polishing amount was set to 25% of the whole film thickness of the $SrBi_2Ta_2O_9$ film of 200 nm, i.e., 50 nm, so that the final film thickness became 150 nm. Process damages of the devices subjected to flattening of the capacitor dielectric film by such CMP process as described above and comparative devices subjected to no flattening of the capacitor dielectric film were evaluated in the manner as described above. As a result, the devices subjected to the flattening of the dielectric film by the CMP process exhibited almost no changes in the ferroelectric characteristics even after the immersion into the resist stripping solution.

In the above embodiments, $SrBi_2Ta_2O_9$ is used as the ferroelectric. However, similar effects can be obtained also with bismuth-based laminar structure compounds such as $BaBi_2Nb_2O_9$, $BaBi_2Ta_2O_9$, $PbBi_2Ta_2O_9$, $PbBi_2Nb_2O_9$, $PbBi_4Ti_4O_{15}$, $SrBi_4Ti_4O_{15}$, $BaBi_4Ti_4O_{15}$, $Sr_2Bi_4Ti_5O_{18}$, $Ba_2Bi_4Ta_5O_{18}$, $Pb_2Bi_4Ti_5O_{18}$, $Na_{0.5}Bi_{4.5}Ti_{O15}$, $K_{0.5}Bi_{4.5}Ti_4O_{15}$, $SrBi_2(Ta_xNb_{1-x})_2O_9$, $(SrBi_2Ta_2O_9)_{0.7}$·$(Bi_3TiTaO_9)_{0.3}$, $(SrBi_2(Ta_xNb_{1-x})_2O_9)_{0.7}$·$(Bi_3TiTaO_9)_{0.3}$ and $Bi_4Ti_3O_{12}$.

Also, the ferroelectric material is used in the above embodiments. However, this is not limitative, and similar effects can be obtained also by $SrTiO_3$ and $(Ba_xSr_{1-x})TiO_3$ which are high dielectric constant materials.

Also, the MOD process is used as the film formation method for the ferroelectric film in the above embodiments. Alternatively, sputtering process, vacuum evaporation process, MOCVD process or the like may be used.

Further, the lower electrode is made of Pt in the above embodiments. However, other materials may be used as far as they are capable of educing the ferroelectric characteristics, and similar effects can be obtained also by an Ir electrode, an $IrO_2$ electrode, an $IrO_2$—Ir laminated electrode ($IrO_2$/Ir), a Pt—Rh alloy (PtRh) electrode, a Pt—Rh alloy oxide ($PtRhO_x$) electrode, a $PtRhO_x$—PtRh laminated electrode ($PtRhO_x$/PtRh), an Ir—TiN laminated electrode (Ir/TiN), an $IrO_2$—Ir—TiN laminated electrode ($IrO_2$/Ir/TiN), a Pt—Ir—TiN laminated electrode (Pt/Ir/TiN), a Pt—$IrO_2$—Ir—TiN laminated electrode (Pt/$IrO_2$/Ir/TiN), an Ir—TaSiN laminated electrode (Ir/TaSiN), an $IrO_2$—Ir—TaSiN laminated electrode ($IrO_2$/Ir/TaSiN), a Pt—Ir—TaSiN laminated electrode (Pt/Ir/TaSiN), a Pt—$IrO_2$—Ir—TaSiN laminated electrode (Pt/$IrO_2$/Ir/TaSiN) or the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor memory device, the semiconductor memory device comprising a capacitor having a lower electrode, a dielectric film and an upper electrode stacked in this order, the method comprising the steps of:
    forming a dielectric film to a desired film thickness;
    flattening a surface of the dielectric film by removing the dielectric film by a specified amount; and
    forming an upper electrode on the flattened surface of the dielectric film.

2. The method for fabricating a semiconductor memory device according to claim 1, wherein patterning of the dielectric film is performed prior to the step of flattening a surface of the dielectric film.

3. The method for fabricating a semiconductor memory device according to claim 1, wherein patterning of the dielectric film is performed after the step of flattening a surface of the dielectric film.

4. The method for fabricating a semiconductor memory device according to claim 1, wherein the step of flattening a surface of the dielectric film uses a dry etching process.

5. The method for fabricating a semiconductor memory device according to claim 1, wherein the step of flattening a surface of the dielectric film uses a chemical mechanical polishing process.

6. The method for fabricating a semiconductor memory device according to claim 1, wherein the specified amount by which the dielectric film is removed is within a range of from 20% to 50% of the desired film thickness to which the dielectric film has been formed.

7. The method for fabricating a semiconductor memory device according to claim 1, wherein the desired film thickness of the dielectric film is between 50 nm and 300 nm, and preferably between 100 nm and 250 nm.

8. The method for fabricating a semiconductor memory device according to claim 1, wherein the dielectric film is a ferroelectric film.

9. The method for fabricating a semiconductor memory device according to claim 8, wherein the ferroelectric film is made of a bismuth-based laminar structure compound.

10. The method for fabricating a semiconductor memory device according to claim 1, wherein the dielectric film is a high dielectric constant film.

11. The method for fabricating a semiconductor memory device according to claim 10, wherein the high dielectric constant film is made of $SrTiO_3$ or $(Ba_xSr_{1-x})TiO_3$ (where $0<x<1$).

12. The method for fabricating a semiconductor memory device according to claim 4, wherein in the step of flattening a surface of the dielectric film, at least one kind of gas selected from a group consisting of halogens, halogen compounds and rare gases is used as an etching gas.

13. The method for fabricating a semiconductor memory device according to claim 12, wherein hydrocarbon is added to the etching gas.

14. The method for fabricating a semiconductor memory device according to claim 4, wherein in the step of flattening a surface of the dielectric film, mixture of a halogen gas, a halogen compound gas and a hydrocarbon gas is used as an etching gas.

15. The method for fabricating a semiconductor memory device according to claim 4, further comprising:

performing a heat treatment at a temperature of 500° C.–700° C. in an atmosphere of oxygen, nitrogen, or a mixed gas of oxygen and nitrogen to repair damage of the dielectric film caused by the dry etching.

16. A method for fabricating a semiconductor memory device having a MOS transistor and a capacitor formed on a semiconductor substrate, a source/drain of the MOS transistor being connected with a lower electrode of the capacitor by an electrical conductor, the method comprising the steps of:

depositing a lower electrode material and a dielectric material in this order and patterning these materials together into a lower electrode and a dielectric film of the capacitor;

forming an insulating film all over the semiconductor substrate including the lower electrode and the dielectric film;

forming an opening in the insulating film to expose a surface of the dielectric film;

flattening the exposed surface of the dielectric film by removing the dielectric material by a specified amount; and forming an upper electrode in contact with the flattened surface of the dielectric film.

17. The method for fabricating a semiconductor memory device according to claim 16, wherein, before the step of depositing a lower electrode material and a dielectric material, the method further comprises the steps of:

forming a MOS transistor on the silicon substrate;

depositing an interlayer insulator on the MOS transistor;

forming, in the interlayer insulator, a contact hole leading to a diffusion layer serving as the source/drain of the MOS transistor;

filling the contact hole with an electrical conductive material to form a contact plug serving as the electrical conductor, wherein the lower electrode material and the dielectric material are deposited on the interlayer insulator including the contact plug.

18. The method for fabricating a semiconductor memory device according to claim 16, wherein the dielectric film is a ferroelectric film.

19. The method for fabricating a semiconductor memory device according to claim 16, wherein the step of flattening the exposed surface of the dielectric material uses a dry etching process and the specified amount by which the dielectric material is to be removed is within a range of from 20% to 50% of a film thickness to which the dielectric material has been deposited.

20. The method for fabricating a semiconductor memory device according to claim 19, wherein the dry etching process uses mixture of a halogen gas, a halogen compound gas and a hydrocarbon gas as an etching gas.

21. The method for fabricating a semiconductor memory device according to claim 19, further comprising:

performing a heat treatment at a temperature of 500° C.–700° C. in an atmosphere of oxygen, nitrogen, or a mixed gas of oxygen and nitrogen to repair damage of the dielectric film caused by the dry etching.

22. A method for fabricating a semiconductor memory device having a MOS transistor and a capacitor formed on a semiconductor substrate, a source/drain of the MOS transistor being connected with a lower electrode of the capacitor by an electrical conductor, the method comprising the steps of:

depositing a lower electrode material and a dielectric material in this order;

flattening a surface of the dielectric material by removing the dielectric material by a specified amount;

depositing an upper electrode material on the flattened surface of the dielectric material;

patterning the lower electrode material, the dielectric material and the upper electrode material together into a lower electrode, a dielectric film and an upper electrode of the capacitor, respectively;

forming an insulating film all over the resulting semiconductor substrate including the lower electrode, dielectric film and upper electrode;

forming an opening in the insulating film to expose a surface of the upper electrode; and forming a drive line of a wiring material in contact with the exposed surface of the upper electrode.

23. The method for fabricating a semiconductor memory device according to claim 22, wherein, before the step of depositing a lower electrode material and a dielectric material, the method further comprises the steps of:

forming a MOS transistor on the silicon substrate;

depositing an interlayer insulator on the MOS transistor;

forming, in the interlayer insulator, a contact hole leading to a diffusion layer serving as the source/drain of the MOS transistor;

filling the contact hole with an electrical conductive material to form a contact plug serving as the electrical conductor, wherein the lower electrode material and the dielectric material are deposited on the interlayer insulator including the contact plug.

24. The method for fabricating a semiconductor memory device according to claim 22, wherein the dielectric film is a ferroelectric film.

25. The method for fabricating a semiconductor memory device according to claim 22, wherein the step of flattening a surface of the dielectric material uses a dry etching process, and the specified amount by which the dielectric material is to be removed is within a range of from 20% to 50% of a film thickness to which the dielectric material has been deposited.

26. The method for fabricating a semiconductor memory device according to claim 22, wherein the step of flattening a surface of the dielectric material uses a chemical mechanical polishing process, and the specified amount by which the dielectric material is to be removed is within a range of from 20% to 50% of a film thickness to which the dielectric material has been deposited.

27. The method for fabricating a semiconductor memory device according to claim 25, wherein the dry etching process uses mixture of a halogen gas, a halogen compound gas and a hydrocarbon gas as an etching gas.

28. The method for fabricating a semiconductor memory device according to claim 25, further comprising:
performing a heat treatment at a temperature of 500° C.–700° C. in an atmosphere of oxygen, nitrogen, or a mixed gas of oxygen and nitrogen to repair damage of the dielectric film caused by the dry etching.

* * * * *

UNITED STATES PATENT AND TRADEMARK OFFICE
CERTIFICATE OF CORRECTION

PATENT NO. : 6,232,174 B1
DATED : May 15, 2001
INVENTOR(S) : Nagata et al.

Page 1 of 1

It is certified that error appears in the above-identified patent and that said Letters Patent is hereby corrected as shown below:

Title page,
Delete,

"[75] Inventors: Masaya Nagata; Nobuhito Ogata, both of Nara; Kazuya Ishihara, Soraku-gun; Jun Kudo, Nara, all of (JP)"

and insert therefor

-- [75] Inventors: Masaya Nagata, Nara; Nobuhito Ogata, Tenri; Kazuya Ishihara, Soraku-gun; Jun Kudo, Nara, all of (JP) --.

Delete

"[30] Foreign Application Priority Data

Apr. 22, 1998 (JP) 11-111217
Jan. 28, 1999 (JP) 11-019394"

and insert therefor

-- [30] Foreign Application Priority Data

Apr. 22, 1998 (JP) 10-111217
Jan. 28, 1999 (JP) 11-019394 --.

Signed and Sealed this

Thirteenth Day of November, 2001

*Attest:*

*Attesting Officer*

NICHOLAS P. GODICI
*Acting Director of the United States Patent and Trademark Office*